(12) United States Patent
Standaert et al.

(10) Patent No.: US 11,302,630 B2
(45) Date of Patent: Apr. 12, 2022

(54) ELECTRODE-VIA STRUCTURE

(71) Applicant: International Business Machines Corporation, Armonk, NY (US)

(72) Inventors: Theodorus E. Standaert, Clifton Park, NY (US); Chih-Chao Yang, Glenmont, NY (US); Daniel Charles Edelstein, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 101 days.

(21) Appl. No.: 16/842,951

(22) Filed: Apr. 8, 2020

(65) Prior Publication Data
US 2021/0320060 A1    Oct. 14, 2021

(51) Int. Cl.
*H01L 23/522* (2006.01)
*H01L 21/768* (2006.01)
*H01L 21/321* (2006.01)
*H01L 43/12* (2006.01)

(52) U.S. Cl.
CPC ...... *H01L 23/5226* (2013.01); *H01L 21/3212* (2013.01); *H01L 21/7684* (2013.01); *H01L 21/7685* (2013.01); *H01L 21/76802* (2013.01); *H01L 21/76843* (2013.01); *H01L 21/76847* (2013.01); *H01L 21/76883* (2013.01); *H01L 21/76885* (2013.01); *H01L 43/12* (2013.01)

(58) Field of Classification Search
CPC ........... H01L 21/32115; H01L 21/3212; H01L 21/7684; H01L 21/28141; H01L 21/28132
See application file for complete search history.

(56) References Cited

U.S. PATENT DOCUMENTS

| | | | |
|---|---|---|---|
| 7,112,454 B2 * | 9/2006 | Drewes | H01L 27/222 257/E21.66 |
| 7,223,612 B2 | 5/2007 | Sarma | |
| 7,419,882 B2 | 9/2008 | Wu et al. | |
| 7,442,624 B2 | 10/2008 | Sarma et al. | |
| 7,545,740 B2 | 6/2009 | Zelig et al. | |
| 7,674,717 B2 | 3/2010 | Wang et al. | |
| 7,678,659 B2 | 3/2010 | Tu et al. | |
| 8,772,888 B2 * | 7/2014 | Jung | H01L 43/12 257/421 |
| 9,059,394 B2 | 6/2015 | Breitwisch | |

(Continued)

*Primary Examiner* — Marcos D. Pizarro
*Assistant Examiner* — William H Anderson
(74) *Attorney, Agent, or Firm* — Cantor Colburn LLP; L. Jeffrey Kelly (57) ABSTRACT

A via structure and methods for forming a via structure generally includes a via opening in a dielectric layer. A conformal barrier layer is in the via opening; and a conductive metal on the barrier layer in the via opening. The conductive metal includes a recessed top surface. A conductive planarization stop layer is on the recessed top surface and extends about a shoulder portion formed in the dielectric layer, wherein the shoulder portion extends about a perimeter of the via opening. A fill material including an insulator material or a conductor material is on the conductive planarization stop layer within the recessed top surface, wherein the conductive planarization stop layer on the shoulder portion is coplanar to the insulator material or the conductor material. Also described are methods of fabricating the via structure.

8 Claims, 6 Drawing Sheets

(56) References Cited

U.S. PATENT DOCUMENTS

| | | |
|---|---|---|
| 9,972,672 B1 * | 5/2018 | Edelstein .......... H01L 23/53238 |
| 10,043,705 B2 | 8/2018 | Chu et al. |
| 10,461,248 B2 | 10/2019 | Bhosale |
| 2006/0017180 A1 | 1/2006 | Sarma |
| 2006/0024923 A1 | 2/2006 | Sarma et al. |
| 2006/0234440 A1 | 10/2006 | Wu et al. |
| 2006/0275929 A1 | 12/2006 | Wang et al. |
| 2007/0072361 A1 | 3/2007 | Tu et al. |
| 2012/0086089 A1 * | 4/2012 | Li .................. H04W 52/12 |
| | | 257/421 |
| 2012/0139119 A1 | 7/2012 | Breitwisch |
| 2015/0348831 A1 * | 12/2015 | Brovman .......... H01L 21/7684 |
| | | 438/653 |
| 2017/0352804 A1 * | 12/2017 | Chuang ................ H01L 43/02 |
| 2018/0108835 A1 | 4/2018 | Huang et al. |
| 2018/0158728 A1 | 6/2018 | Chu et al. |
| 2018/0287051 A1 | 10/2018 | Bhosale et al. |
| 2019/0058109 A1 | 2/2019 | Chen et al. |

\* cited by examiner

ELECTRODE-VIA STRUCTURE

BACKGROUND

This invention relates generally to formation of semiconductor devices and methods of manufacturing the same, and more particularly, to methods and via structures for forming an electrode-via structure.

Semiconductor structures are typically fabricated using multiple layers, which can include two or more patterned conductive layers separated by intervening insulation layers. Considering the layers to be horizontally stacked, vertical points of contact between the two or more conductive layers through the insulation layers are known as via structures, which together provide a wiring pattern for the integrated circuit.

SUMMARY

Embodiments of the present invention are generally directed to a via structure in accordance with one or more aspects of the present invention. A non-limiting example of a via structure includes a via opening in a dielectric layer. A conformal barrier layer is provided in the via opening. A conductive metal is on the conformal barrier layer and fills the via opening. The conductive metal includes a recessed top surface. A conductive planarization stop layer is on the recessed top surface of the conductive metal and on a shoulder portion of the dielectric layer extending about a perimeter of the via opening. A fill material fills the recessed top surface such that the conductive planarization stop layer on the shoulder portion of the dielectric layer is coplanar to the fill material.

A non-limiting example of a semiconductor structure in accordance with one or more aspects of the present invention includes a metallization level including a plurality of conductive line features formed within a first interlayer dielectric. A via structure overlays the metallization level. The via structure includes a via opening in a dielectric cap layer. A conformal barrier layer is in the via opening. A conductive metal is on the conformal barrier layer and fills the via opening. The conductive metal includes a recessed top surface. A conductive planarization stop layer is on the recessed top surface of the conductive metal and on a shoulder portion of the dielectric layer extending about a perimeter of the via opening. A fill material fills the recessed top surface such that the conductive planarization stop layer on the shoulder portion of the dielectric layer is coplanar to the fill material. A pillar structure is formed on the coplanar surface defined by the conductive planarization stop layer and the fill material within the recessed top surface of the via structure. Sidewall spacers are provided about the pillar structure, and a line feature is in the second interlayer dielectric overlying the pillar structure and a portion of the sidewall spacers. The line feature includes a barrier layer and a bulk conductor.

A non-limiting example of a method of forming a semiconductor structure in accordance with one or more aspects of the present invention includes depositing a dielectric cap layer onto a metallization level including a plurality of line features formed within an interlayer dielectric. The dielectric cap layer is patterned to form a via opening orthogonal to a selected one of the line features. A barrier layer is conformally deposited. A bulk conductor is deposited filling the via opening and forming an overburden thereon. Planarizing the overburden removes the overburden from the dielectric cap layer and forms a recess in the bulk conductor. A conductive planarization stop layer is conformally deposited. A bottom electrode material is deposited and planarized to the conductive planarization layer such that the bottom electrode material is confined to the recess and is coplanar to the conductive planarization stop layer on the dielectric layer. One or more layers are deposited and patterned to form an interconnect, a metal stack, a memory stack or a combination thereof.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

Figure ("FIG.") 1 is a schematic cross-sectional view depicting a partially completed integrated circuit structure in accordance with one or more embodiments of the present invention.

It will be appreciated that for simplicity and clarity of illustration, elements shown in the drawings have not necessarily been drawn to scale. For example, the dimensions of some of the elements can be exaggerated relative to other elements for purpose of clarity.

DETAILED DESCRIPTION

The present invention is generally directed to via structures and methods of fabrication for subsequent formation of an interconnect structure, a metal stack, a memory stack, or a combination thereof. One of the problems with fabricating via structures for advanced design rules is the formation of voids within the via structure. For example, deposition of tantalum nitride or titanium nitride typically utilizes plasma vapor deposition or chemical vapor deposition, which can result in voids within the via structure.

In the present invention, void formation is generally eliminated by forming a recessed via surface. A planarization stop layer formed of a conductive material is conformally deposited onto a structure including the recessed via surface. Subsequent deposition of a conductor layer embeds the conductive planarization stop layer and the fill material within the recess of the recessed via structure, which results in a flat bottom electrode structure. The flat bottom electrode structure provides low resistance to subsequent formation of the interconnect structure, metal stack, memory stack or combinations thereof.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The photoresist can be formed using conventional deposition techniques such chemical vapor deposition, plasma vapor deposition, sputtering, dip coating, spin-on coating, brushing, spraying and other like deposition techniques can be employed. Following formation of the photoresist, the photoresist is exposed to a desired pattern of radiation such as X-ray radiation, extreme ultraviolet (EUV) radiation, electron beam radiation or the like. Next, the exposed photoresist is developed utilizing a conventional resist development process.

After the development step, the etching step can be performed to transfer the pattern from the patterned photoresist into the interlayer dielectric. The etching step used in forming the at least one opening can include a dry etching process (including, for example, reactive ion etching, ion beam etching, plasma etching or laser ablation), a wet chemical etching process or any combination thereof.

Figure 1:
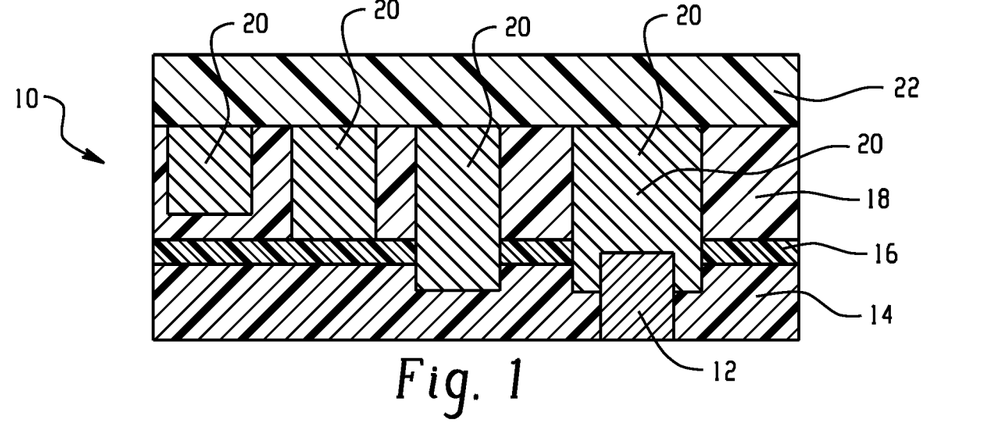

Figure ("FIG.") 1 is a schematic cross-sectional view depicting a partially completed integrated circuit structure 10 in accordance with one or more embodiments of the present invention. The integrated circuit structure 10 includes first via structure 12 formed within a first interlayer dielectric 14 and a dielectric cap layer 16 thereon. A second interlayer dielectric 18 is formed on the dielectric cap layer 16 and includes a plurality of metal conductor filled lines 20, wherein at least one of the metal lines is electrically coupled to the via structure as shown in the cross section. A dielectric layer 22 is formed on a planarized surface of the second interlayer dielectric 18 and metal lines.

The interlayer dielectrics 14, 18 can be composed of an inorganic dielectric material or an organic dielectric material. In some embodiments, the interlayer dielectrics 14, 18 can be porous. In other embodiments, the interlayer dielectrics 14, 18 can be non-porous. Examples of suitable dielectric materials that can be employed as the interlayer dielectrics 14, 18 include, but are limited to, silicon dioxide, undoped or doped silicate glass, silsesquioxanes, C doped oxides (i.e., organosilicates) that include atoms of Si, C, O and H, thermosetting polyarylene ethers or any multilayered combination thereof. The term "polyarylene" is used in this present application to denote aryl moieties or inertly substituted aryl moieties which are linked together by bonds, fused rings, or inert linking groups such as, for example, oxygen, sulfur, sulfone, sulfoxide, or carbonyl.

The interlayer dielectrics 14, 18 can have a dielectric constant (all dielectric constants mentioned herein are measured relative to a vacuum, unless otherwise stated) that is about 4.0 or less. In one or embodiments, the interlayer dielectrics 14, 18 have a dielectric constant of 2.8 or less. These dielectrics generally having a lower parasitic cross talk as compared to dielectric materials whose dielectric constant is greater than 4.0.

The interlayer dielectrics 14, 18 can be formed by a deposition process such as, for example, chemical vapor deposition (CVD), plasma enhanced chemical vapor deposition (PECVD) or spin-on coating. The interlayer dielectrics 14, 18 can have a thickness from 50 nm to 250 nm. Other thicknesses that are lesser than 50 nm, and greater than 250 nm can also be employed in the present invention.

The dielectric cap layer 16 can be can include any dielectric material such as, for example, silicon carbide (SiC), silicon nitride (Si3N4), silicon dioxide (SiO2), a carbon doped oxide, a nitrogen and hydrogen doped silicon carbide (SiC(N,H)) or a multilayered stack of at least one of the aforementioned dielectric capping materials. The capping material that provides the dielectric cap layer 16 can be formed utilizing a deposition process such as, for example, CVD, PECVD, ALD, chemical solution deposition or evaporation. When present, dielectric cap layer 16 can have a thickness from 10 nm to 100 nm. Other thicknesses that are lesser than 10 nm, or greater than 100 nm can also be used as the thickness of the dielectric cap layer 16.

The metal conductors 20 and underlying via structure 12 can be composed of copper (Cu), aluminum (Al), tungsten (W), or an alloy thereof such as, for example, a Cu—Al alloy. The metal or metal alloy can be formed utilizing a deposition process such as, for example, CVD, PECVD, sputtering, chemical solution deposition or plating.

In one or more embodiments, an optional plating seed layer (not specifically shown) can be formed on the surface of the first diffusion barrier material. In cases in which the conductive material to be subsequently and directly formed on the first diffusion barrier material, the optional plating seed layer is not needed. The optional plating seed layer is employed to selectively promote subsequent electroplating of a pre-selected conductive metal or metal alloy. The optional plating seed layer can be composed of Cu, a Cu alloy, Ir, an Ir alloy, Ru, a Ru alloy (e.g., TaRu alloy) or any other suitable noble metal or noble metal alloy having a low metal-plating overpotential. Typically, Cu or a Cu alloy plating seed layer is employed, when a Cu metal is to be subsequently formed within the at least one opening. The thickness of the optional plating seed layer can vary depending on the material of the optional plating seed layer as well as the technique used in forming the same. Typically, the optional plating seed layer has a thickness from 2 nm to 80 nm. The optional plating seed layer can be formed by a conventional deposition process including, for example, CVD, PECVD, ALD, or PVD.

The dielectric layer 22 can be the same or different from interlayer dielectrics 14, 18, e.g., a low k oxide, Si, SIN, SiC(N,H) or the like.

Figure 2:
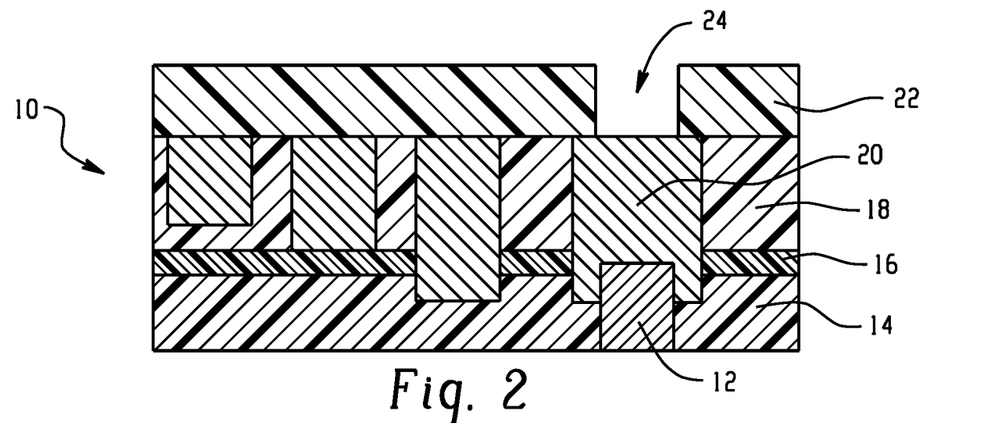
FIG. 2 is schematic cross-sectional view of the partially completed integrated circuit structure of FIG. 1 subsequent to anisotropic patterning of a via within a dielectric layer in accordance with one or more embodiments of the present invention.

FIG. 2 is schematic cross-sectional view of the partially completed integrated circuit structure of FIG. 1 subsequent to lithographic patterning of a via 24 opening within dielectric layer 22 in accordance with one or more embodiments of the present invention. The via opening 24 is aligned with one of the metal lines 20 and the underlying via structure 12.

The dielectric layer 22 can be patterned by conventional lithographic techniques, which generally includes deposition of a photoresist layer, exposure to activating radiation followed by development of the photoresist to form a desired pattern. The photoresist can be a positive photoresist or a negative photoresist. Transferring the patterned photoresist to the dielectric layer 22 generally include a directional etching process such as reactive ion etch (RIE), ion beam etching, laser etching, and/or plasma etching.

Figure 3:
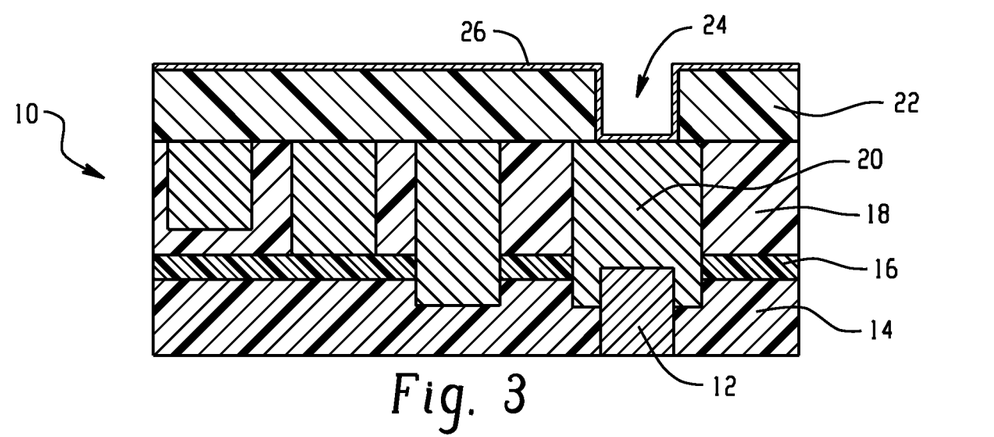
FIG. 3 is a schematic cross-sectional view of the structure of FIG. 2 subsequent to deposition of a conformal barrier layer in accordance with one or more embodiments of the present invention.

FIG. 3 is a schematic cross-sectional view of the structure of FIG. 2 subsequent to deposition of a conformal barrier layer 26 in accordance with one or more embodiments of the present invention.

The barrier material defining the conformal barrier layer 26 can include tantalum (Ta), tantalum nitride (TaN), titanium (Ti), titanium nitride (TiN), cobalt (Co), cobalt nitride (CoN), ruthenium (Ru), ruthenium nitride (RuN), ruthenium tantalum (RuTa), ruthenium tantalum nitride (RuTaN), tungsten (W), tungsten nitride (WN), alloys thereof or any other material that can serve as a barrier to prevent a conductive material from diffusing there through. The thickness of the first diffusion barrier material can vary depending on the deposition process used as well as the material employed. In some embodiments, the barrier material can have a thickness from 2 nm to 50 nm; although other thicknesses for the diffusion barrier material are contemplated and can be employed in the present invention as long as the barrier material does not entirely fill the opening. The barrier material can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition or plating.

Figure 4:
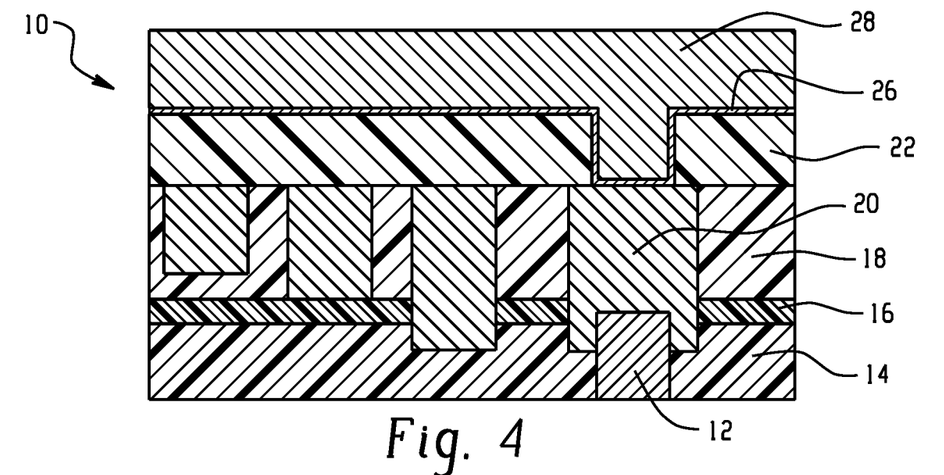
FIG. 4 is a schematic cross-sectional view of the structure of FIG. 3 subsequent to deposition of a conductor layer including an overburden in accordance with one or more embodiments of the present invention.

FIG. 4 is a schematic cross-sectional view of the structure of FIG. 3 subsequent to deposition of a conductor layer 28 including an overburden in accordance with one or more embodiments of the present invention. The conductor layer can be formed of copper (Cu), aluminum (Al), tungsten (W), or an alloy thereof such as, for example, a Cu—Al alloy. The metal or metal alloy can be formed utilizing a deposition process such as, for example, CVD, PECVD, sputtering, chemical solution deposition or plating. An optional seed layer as previously discussed can be provided to promote adhesion of the metal conductor to the barrier layer 26.

Figure 5:
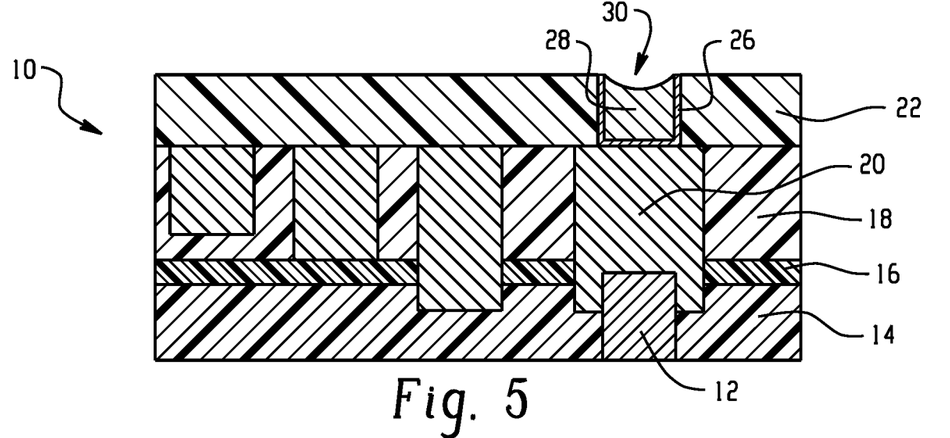
FIG. 5 is a schematic cross-sectional view of the structure of FIG. 4 subsequent planarization to remove the overburden and form a recess in the via structure in accordance with one or more embodiments of the present invention.

FIG. 5 is a schematic cross-sectional view of the structure of FIG. 4 subsequent planarization to remove the overburden of the conductor layer 28 and form a recess 30 in the via structure in accordance with one or more embodiments of the present invention. The planarization process removes any metal overburden (includes seed layer and liner layer removal) from the surface of the dielectric layer 22 and is adjusted to provide dishing of the metal within the via structure. Dishing is a phenomenon of the planarization process where features do not polish straight across, but curve convexly or concavely in the same sense as concave and convex optical lenses are defined. In one example, the maximum depth of the recess 30 is between about 1 nanometer (nm) and about 100 nm below top surface of the dielectric layer 22.

Exemplary planarization processes for removing the overburden and form the recess 30 include, without limitation, electropolishing, chemical planarization (CMP), non-selective plasma etching process, and the like. In an electropolishing process, small amounts of metal are etched by electroetch or electrochemically etched. The CMP process generally includes an abrasive and corrosive chemical slurry (commonly a colloid) in conjunction with a polishing pad and retaining ring, typically of a greater diameter than the wafer. The pad and wafer are pressed together by a dynamic polishing head and held in place by a plastic retaining ring. The dynamic polishing head is rotated with different axes of rotation. This removes excess material and tends to even out any irregular topography, making the wafer flat or planar. However, CMP of the via structure is adjusted to effect dishing (also referred to as recess formation) within the via structure.

Figure 6:
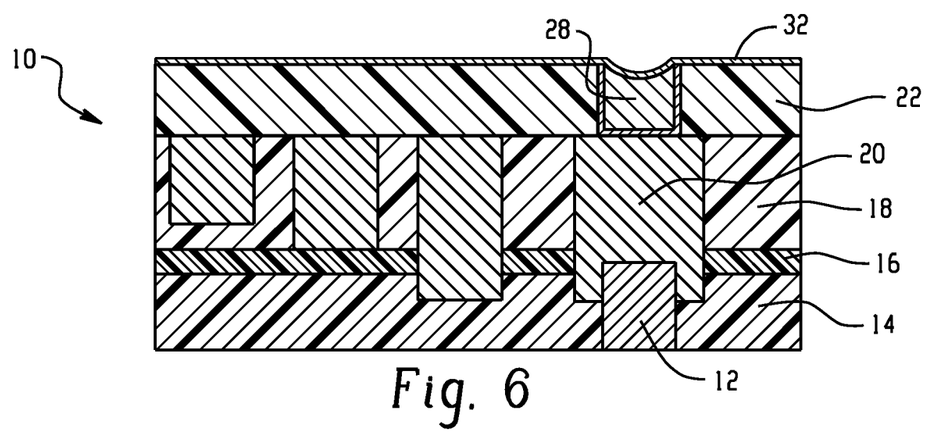
FIG. 6 is a schematic cross-sectional view of the structure of FIG. 5 subsequent to conformal deposition of a conductive planarization stop layer onto the structure with one or more embodiments of the present invention.

FIG. 6 is a schematic cross-sectional view of the structure of FIG. 5 subsequent to conformal deposition of a conductive planarization stop layer 32 onto the structure in accordance with one or more embodiments of the present invention. The conductive planarization stop layer can be formed of a conductive material such as, but not limited to, tantalum, tungsten, titanium, ruthenium, iridium, rhodium, nitrides thereof, alloys thereof, or the like. The conductive planarization stop layer can be conformally deposited by ALD, PCD, CVD, or the like. In one or more embodiments, the conductive planarization stop layer 32 can have a thickness from 2 nm to 50 nm; although other thicknesses for the conductive planarization stop layer 32 are contemplated and can be employed.

Figure 7:
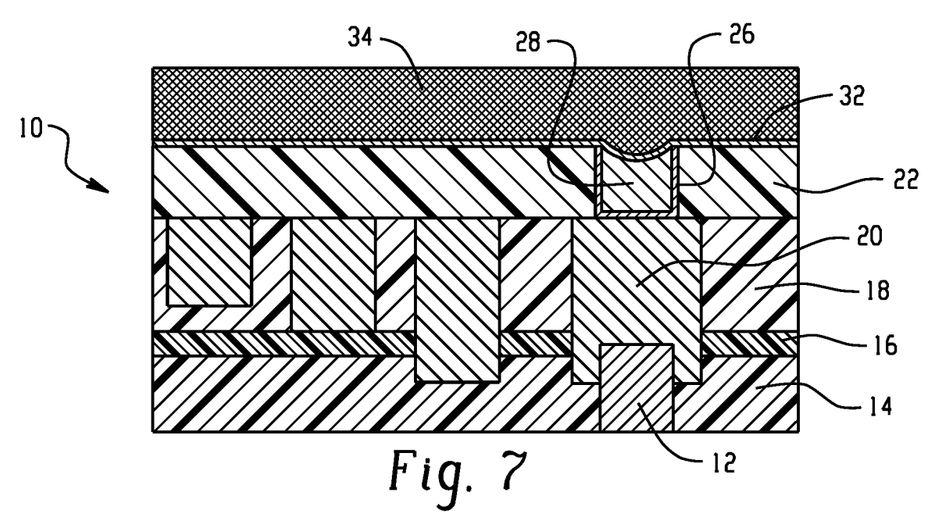
FIG. 7 is a schematic cross-sectional view of the structure of FIG. 6 subsequent to deposition of a fill material in accordance with one or more embodiments of the present invention.

FIG. 7 is a schematic cross-sectional view of the structure of FIG. 6 subsequent to deposition of a filler layer 34 of a conductive material or an insulating material in accordance with one or more embodiments of the present invention.

When the filler layer 34 is a conductive material, the conductive material can be copper, aluminum, tantalum, titanium, tungsten, cobalt, ruthenium, rhodium, nitrides thereof, alloys thereof, or combinations thereof.

When the filler layer 34 is an insulating material, the insulating material can be formed of SiO2, SiN, SiC, SiC(N,H), SiC(N, H, B, O) or the like.

Figure 8:
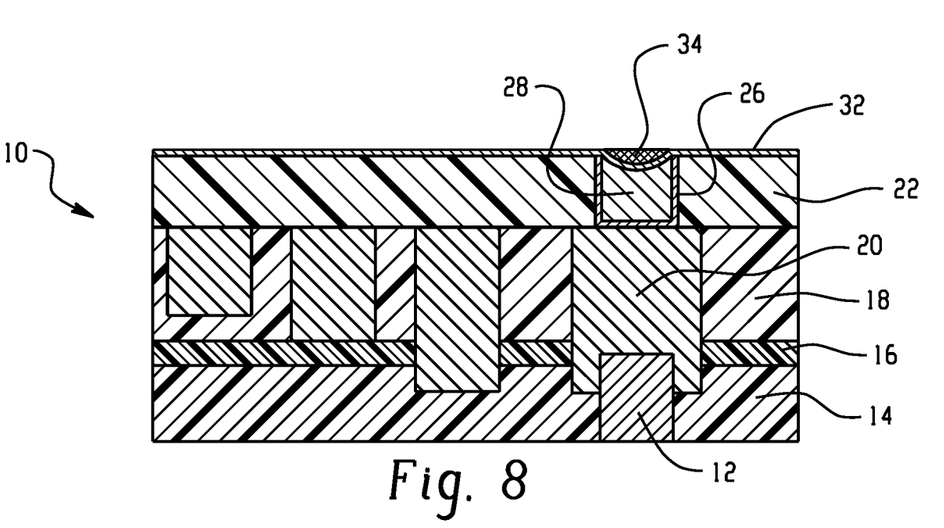
FIG. 8 is a schematic cross-sectional view of the structure of FIG. 7 subsequent to planarization to the stop layer on the dielectric layer in accordance with one or more embodiments of the present invention.

FIG. 8 is a schematic cross-sectional view of the structure of FIG. 7 subsequent to planarization to the stop layer 32 on the dielectric layer 22 in accordance with one or more embodiments of the present invention. As shown, the conductive planarization stop layer 32 overlying the dielectric layer 22 is exposed whereas the filler layer 34 of the conductive or insulative material fills recess 30 and is coplanar to the conductive planarization stop layer 32. The conductive planarization stop layer 32 within the recess is covered with the filler layer 34 of insulating or conductive material.

Figure 9:
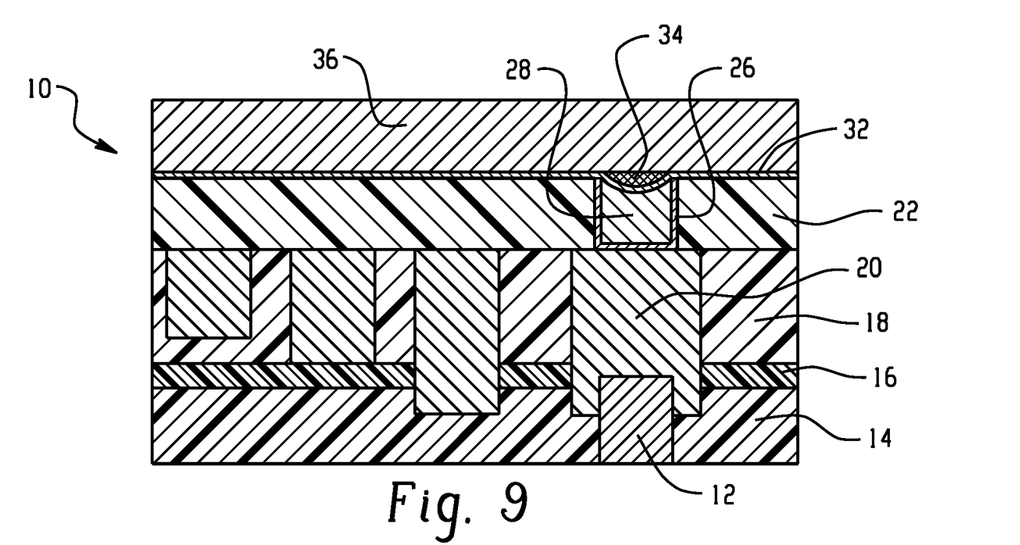
FIG. 9 is a schematic cross-sectional view of the structure of FIG. 8 subsequent to deposition of a conductor layer to form an interconnect structure, a portion of a metal stack, a portion of a memory stack, or a combination thereof in accordance with one or more embodiments of the present invention.

FIG. 9 is a schematic cross-sectional view of the structure of FIG. 8 subsequent to deposition of a conductor layer 36 to form an interconnect structure, a portion of a metal stack, a portion of a memory stack, or a combination thereof in accordance with one or more embodiments of the present invention.

Figure 10:
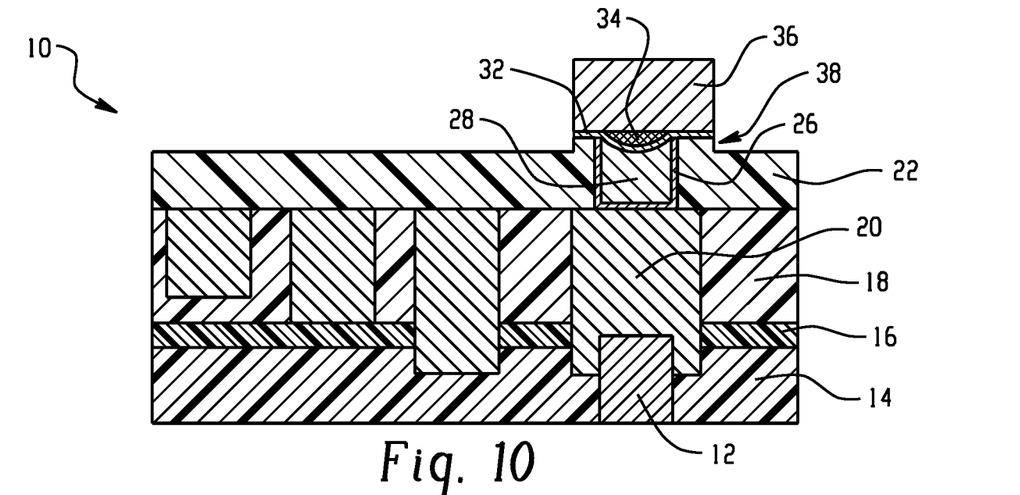
FIG. 10 is a schematic cross-sectional view of the structure of FIG. 9 subsequent to anisotropic patterning of the interconnect structure, the metal stack, the memory stack, or the combination thereof accordance with one or more embodiments of the present invention.

FIG. 10 is a schematic cross-sectional view of the structure of FIG. 9 subsequent to anisotropic patterning into the dielectric layer 22 of the conductor layer 36, i.e., interconnect structure, the metal stack, the memory stack, or the combination thereof accordance with one or more embodiments of the present invention. The anisotropic patterning includes minimal amount of over-etching to remove a portion of the dielectric layer 22, which in the case of metal stacks or memory stacks minimizes damage thereto. The width of the conductor layer 36 is greater than a diameter of the via structure being formed such that the dielectric material 22 provides a raised shoulder 38 of the dielectric material about the perimeter of the via structure being formed as shown relative to the dielectric layer 22. Still further, forming a bottom electrode in the recessed via structure including the conductive planarization stop layer for use in the metal stacks or memory stacks eliminates thickness variability associated with forming these particular devices. Alternatively, an interconnect, e.g., a line feature, can be provided and conductively coupled to the recessed via structure as formed.

Figure 11:
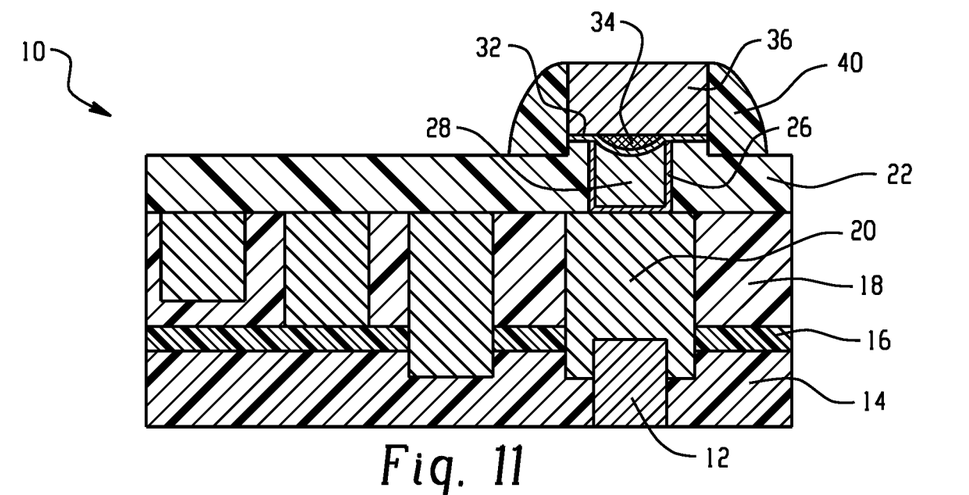
FIG. 11 is a schematic cross-sectional view of the structure of FIG. 10 subsequent to spacer deposition with complete etch back to the dielectric layer about the interconnect structure, the metal stack, the memory stack, or the combination thereof accordance with one or more embodiments of the present invention.
Figure 12:
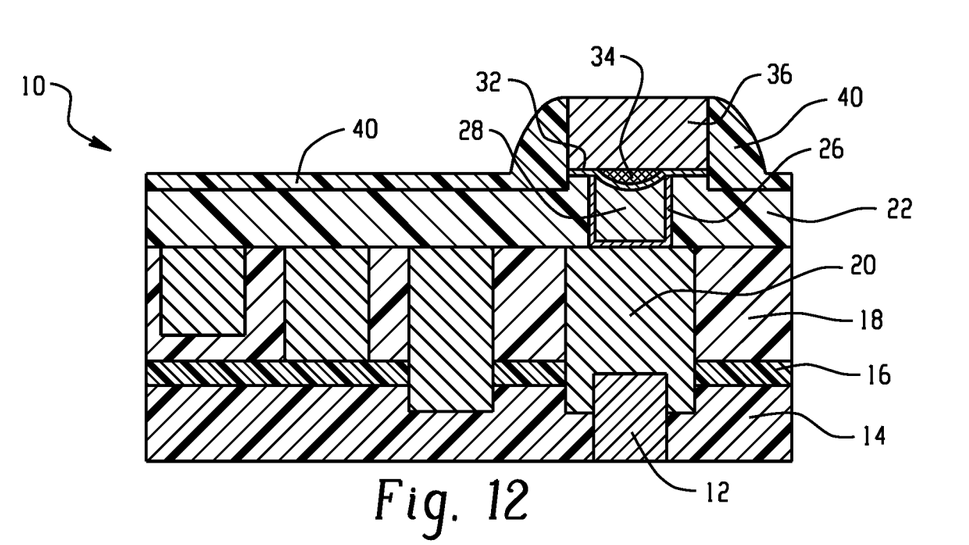
FIG. 12 is a schematic cross-sectional view of the structure of FIG. 10 subsequent to spacer deposition with partial etch back about the interconnect structure, the metal stack, the memory stack, or the combination thereof accordance with one or more embodiments of the present invention.

FIGS. 11 and 12 depict embodiments generally applicable to the conductive layer being a pillar structure such as is encountered in memory stacks (magnetoresistive random access memory (MRAM) devices) or metals stack (e.g., magnetic tunneling junction devices), which typically include alternating metal and insulating layers. Spacers are provided on the sidewalls of these types of pillar structures to provide proper functioning of the devices.

FIG. 11 is a schematic cross-sectional view of the structure of FIG. 10 subsequent to spacer 40 formation with complete etch back to the dielectric layer about the conductive layer 36, i.e., interconnect structure, the metal stack, the memory stack, or the combination thereof accordance with one or more embodiments of the present invention. Formation of spacers 40 is generally known in the art and is not intended to be limited to any particular process. In this embodiment, the dielectric material defining the spacers can be completely removed such as by etching from the bulk surfaces of the dielectric material 22 such that the remaining spacer material is about the sidewalls of the conductor layer 36, which can be an interconnect, memory stack, metal stack, or the like. The spacers 40 can be formed from a single layer or from multiple layers. The spacer can be formed from a dielectric such as, but not limited to, SiN, SiC, SiC(N,H), SiC(N,H, B, O), multiple layers thereof, or the like.

FIG. 12 is a schematic cross-sectional view of the structure of FIG. 10 subsequent to spacer formation with partial etch back about the interconnect structure, the metal stack, the memory stack, or the combination thereof accordance with one or more embodiments of the present invention. In this embodiment, the dielectric material defining the spacers is partially removed such as by etching from the bulk surfaces of the dielectric material 22 such that a thinner layer of the spacer material remains on the dielectric layer 22 in addition to the spacer material about the sidewalls of the conductor layer 36 as shown. The spacers 40 can be formed from a single layer or from multiple layers. The spacer can be formed from a dielectric such as, but not limited to, SiN, SiC, SiC(N,H), SiC(N,H, B, O), multiple layers thereof, or the like.

Figure 13:
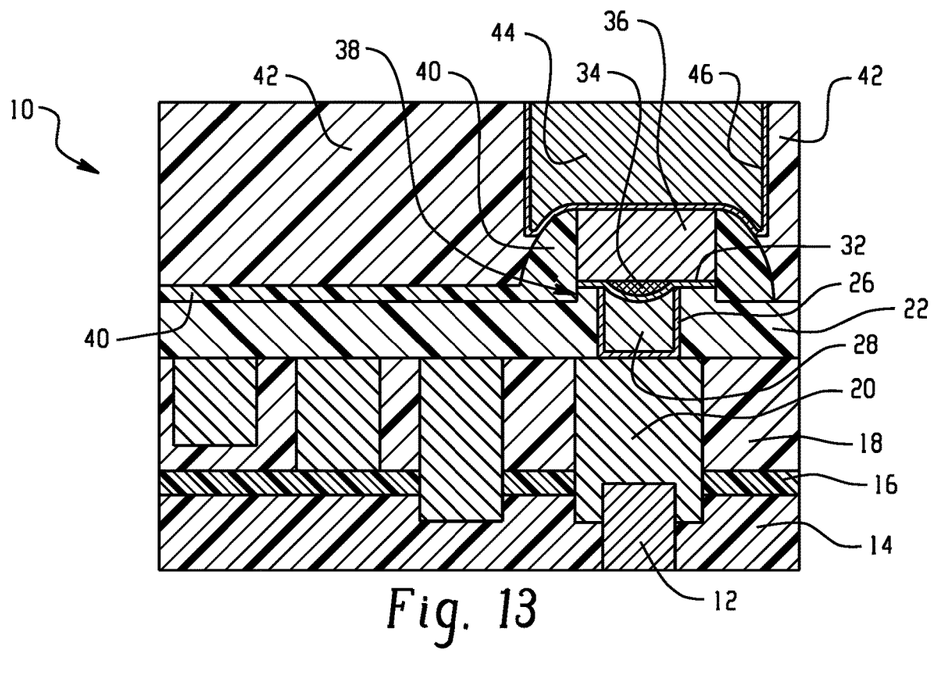
FIG. 13 is a schematic cross-sectional view of the structure of FIG. 12 subsequent to interlayer dielectric deposition, planarization, patterning, and metallization, to the interconnect structure, the metal stack, the memory stack, or the combination thereof accordance with one or more embodiments of the present invention.

FIG. 13 is a schematic cross-sectional view of the structure of FIG. 12 subsequent to interlayer dielectric deposition, planarization, patterning, and metallization, to the interconnect structure, the metal stack, the memory stack, or the combination thereof accordance with one or more embodiments of the present invention. The various steps to form the interconnect to the conductor 36 are well known in the art. The final structure generally includes a patterned interlayer dielectric 42 including a line 44 of conductive material including a barrier layer 46 therein. The line 44 has a width greater than the conductor 36 and partially extends over the sidewall spacers 40.

It should be noted that when the filler layer 34 is an insulator material, conductivity between the conductor layer 36 and the bulk metal 28 in the via is maintained. The planar surfaces of the conductive planarization stop layer 32 on the shoulder 38 of the dielectric layer 22 are electrically coupled to the conductor layer 36 so as to provide indirect contact with the bulk metal 28 the via. The width of the conductor layer 36 is greater than the diameter of the via and is positioned to overlay the via as shown and provides electrical contact with the conductive planarization stop layer 32, which extends on the surface of the recess 30 to provide electrical contact with the bulk metal 28 of the via structure.

While the present invention has been particularly shown and described with respect to preferred embodiments, it will be understood by those skilled in the art that the foregoing and other changes in forms and details can be made without departing from the spirit and scope of the invention. It is therefore intended that the present invention not be limited to the exact forms and details described and illustrated but fall within the scope of the appended claims.

What is claimed is:

1. A semiconductor structure comprising:
   a metallization level including a line feature formed within a first interlayer dielectric;
   a via structure overlaying the metallization level comprising:
   a via opening in a dielectric cap layer;
   a conformal barrier layer in the via opening;
   a conductive metal on the conformal barrier layer and fills the via opening, the conductive metal including a recessed top surface;
   a conductive planarization stop layer is on the recessed top surface of the conductive metal and on a shoulder portion of the dielectric cap layer extending about a perimeter of the via opening; and
   a fill material fills the recessed top surface such that the conductive planarization stop layer on the shoulder portion of the dielectric cap layer is coplanar to the fill material;

a pillar structure formed on the coplanar surface defined by the conductive planarization stop layer and the fill material within the recessed top surface of the conductive metal;

sidewall spacers about the pillar structure, the sidewall spacers directly on a recessed surface of the dielectric cap layer and in direct contact with sidewalls of the conductive planarization stop layer; and a line feature formed in a second interlayer dielectric overlying the pillar structure and a portion of the sidewall spacers, wherein the line feature comprises a barrier layer and a bulk conductor.

2. The semiconductor structure of claim 1, wherein the fill material comprises an insulator material comprising SiO2, SiN, SiC, SiC(N,H), or SiC(N, H, B, O).

3. The semiconductor structure of claim 1, wherein the barrier layer comprises tantalum, tantalum nitride, titanium, titanium nitride, cobalt, cobalt nitride, ruthenium, ruthenium nitride, ruthenium tantalum, ruthenium tantalum nitride, tungsten, tungsten nitride, or alloys thereof.

4. The semiconductor structure of claim 1, wherein the dielectric cap layer comprises silicon carbide (SiC), silicon nitride (Si3N4), silicon dioxide (SiO2), a carbon doped oxide, a nitrogen and hydrogen doped silicon carbide (SiC(N,H)) or a multilayered stack of at least one of the aforementioned dielectric cap materials.

5. The semiconductor structure of claim 1, wherein the conductive planarization layer comprises tantalum, tungsten, titanium, ruthenium, iridium, rhodium, nitrides thereof, alloys thereof.

6. The semiconductor structure of claim 1, wherein sidewall spacers laterally extend on a surface of the dielectric cap layer at a fraction of a height of the sidewall spacers about the pillar structure.

7. The semiconductor structure of claim 1, wherein the line feature in the metallization level, the conductive metal in the via opening, and the line feature formed in the second interlayer dielectric comprise copper, aluminum, tantalum, titanium, tungsten, cobalt, ruthenium, iridium, rhodium, nitrides thereof, or alloys thereof.

8. The semiconductor structure of claim 1, wherein the sidewall spacers comprise multiple layers.

* * * * *